(12) United States Patent  (10) Patent No.: US 8,624,293 B2
Bandyopadhyay et al.  (45) Date of Patent: Jan. 7, 2014

(54) CARBON/TUNNELING-BARRIER/CARBON DIODE

(75) Inventors: Abhijit Bandyopadhyay, San Jose, CA (US); Franz Kreupl, Mountain View, CA (US); Andrei Mihnea, San Jose, CA (US); Li Xiao, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 491 days.

(21) Appl. No.: 12/639,840

(22) Filed: Dec. 16, 2009

(65) Prior Publication Data
US 2011/0140064 A1  Jun. 16, 2011

(51) Int. Cl.
*H01L 29/66* (2006.01)
(52) U.S. Cl.
USPC ............... 257/104; 257/E29.339; 438/263
(58) Field of Classification Search
USPC .................. 257/104, E29.339; 438/263
See application file for complete search history.

(56) References Cited

U.S. PATENT DOCUMENTS

| | | | |
|---|---|---|---|
| 4,845,533 A * | 7/1989 | Pryor et al. ................... | 257/4 |
| 5,122,889 A | 6/1992 | Kaneko et al. | |
| 6,218,677 B1 * | 4/2001 | Broekaert ...................... | 257/22 |
| 7,446,010 B2 | 11/2008 | Li et al. | |
| 2006/0118914 A1 * | 6/2006 | Yoo ............................... | 257/615 |
| 2007/0010094 A1 | 1/2007 | Kreupl et al. | |
| 2008/0035913 A1 * | 2/2008 | Lake et al. ...................... | 257/40 |
| 2008/0070162 A1 * | 3/2008 | Ufert .............................. | 430/290 |
| 2009/0127543 A1 * | 5/2009 | Zhang et al. ................... | 257/25 |
| 2009/0168492 A1 * | 7/2009 | Thorp et al. ................... | 365/148 |

FOREIGN PATENT DOCUMENTS

EP  0269225 A2  6/1988

OTHER PUBLICATIONS

Bhattacharyya et al., "Switching Behaviour and High Frequency Response of Amorphous Carbon Double-barrier Structures," Materials Science and Engineering C, Elsevier Science S.A., CH, vol. 27, No. 5-8, Aug. 8, 2007, pp. 957-960.
International Search Report and Written Opinion of the International Searching Authority dated Jul. 1, 2011, PCT Application No. PCT/US2010/059555, filed Dec. 8, 2010, 7 pages.

\* cited by examiner

*Primary Examiner* — Shaun Campbell
(74) *Attorney, Agent, or Firm* — Vierra Magen Marcus LLP

(57) ABSTRACT

A carbon/tunneling-barrier/carbon diode and method for forming the same are disclosed. The carbon/tunneling-barrier/carbon may be used as a steering element in a memory array. Each memory cell in the memory array may include a reversible resistivity-switching element and a carbon/tunneling-barrier/carbon diode as the steering element. The tunneling-barrier may include a semiconductor or an insulator. Thus, the diode may be a carbon/semiconductor/carbon diode. The semiconductor in the diode may be intrinsic or doped. The semiconductor may be depleted when the diode is under equilibrium conditions. For example, the semiconductor may be lightly doped such that the depletion region extends from one end of the semiconductor region to the other end. The diode may be a carbon/insulator/carbon diode.

23 Claims, 17 Drawing Sheets

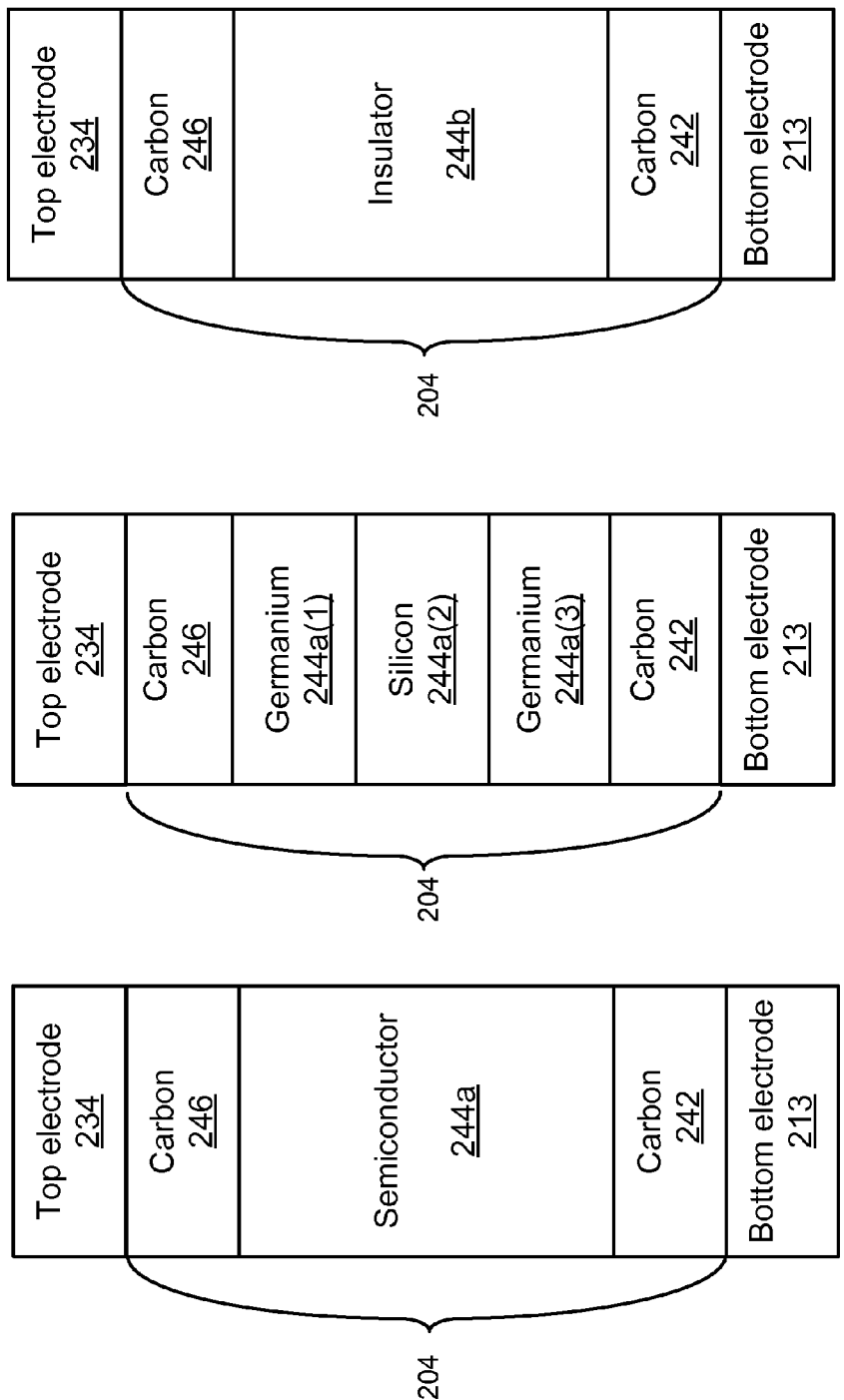

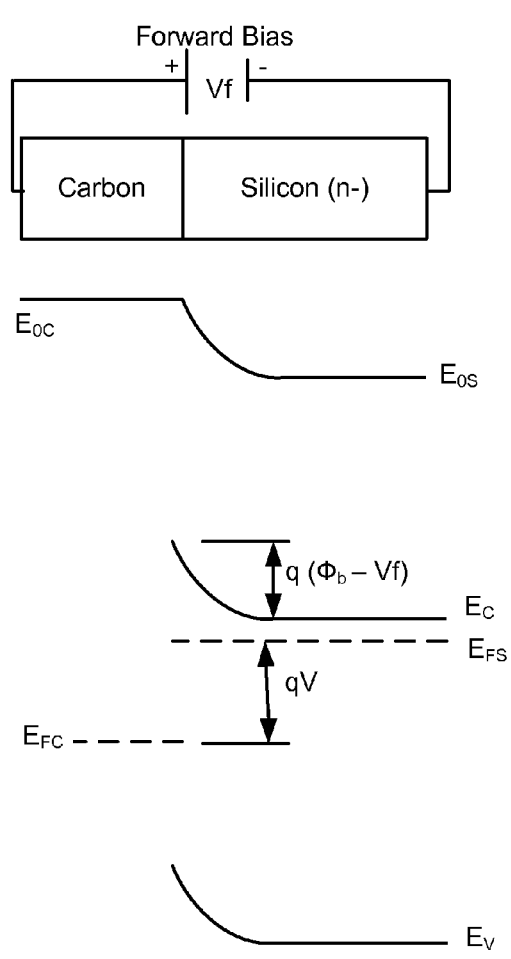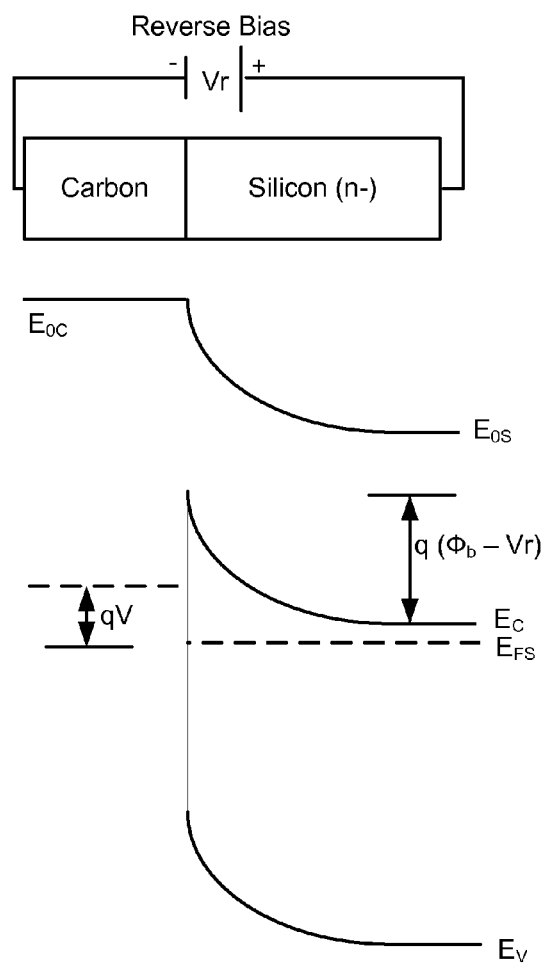
Fig. 2B
Fig. 2C

CARBON/TUNNELING-BARRIER/CARBON DIODE

BACKGROUND

1. Field

This application relates to technology for diodes.

2. Description of the Related Art

A variety of materials show reversible resistivity-switching behavior, and as such may be suitable for use as memory elements. One type of material having reversible resistivity-switching behavior is referred to as resistance change memory (ReRAM). Transition metal oxides have been proposed for ReRAM. A second type of material having reversible resistivity-switching behavior is referred to as phase change memory (PCRAM). Chalcogenides, which may change between a crystalline state (low resistance) and an amorphous state (high resistance), have been proposed for PCRAM. Other materials such as carbon polymers, perovskites, and nitrides have also been proposed as memory elements having reversible resistivity-switching behavior.

Upon application of sufficient voltage, current, or other stimulus, the reversible resistivity-switching material switches to a stable low-resistance state. This resistivity-switching is reversible such that subsequent application of an appropriate voltage, current, or other stimulus can serve to return the reversible resistivity-switching material to a stable high-resistance state. This conversion can be repeated many times. For some switching materials, the initial state is low-resistance rather than high-resistance.

These switching materials are of interest for use in non-volatile memory arrays. One type of memory array is referred to as a cross-point array, which is a matrix of memory elements typically arranged along x-axes (e.g., word lines) and along y-axes (e.g., bit lines). A digital value may be stored as a memory resistance (high or low). The memory state of a memory cell can read by supplying a voltage to the word line connected to the selected memory element. The resistance or memory state can be read as an output voltage or current of the bit line connected to the selected memory cell. One resistance state may correspond to a data "0," for example, while the other resistance state corresponds to a data "1." Some switching materials may have more than two stable resistance states.

Non-volatile memories formed from reversible resistivity-switching elements are known. For example, U.S. Patent Application Publication 2006/0250836, filed May 9, 2005 and titled "REWRITEABLE MEMORY CELL COMPRISING A DIODE AND A RESISTIVITY-SWITCHING MATERIAL," which is hereby incorporated by reference herein in its entirety, describes a rewriteable non-volatile memory cell that includes a diode coupled in series with a reversible resistivity-switching material such as a metal oxide or metal nitride. Such memory cells can be programmed by applying one or more programming signals to cause the reversible resistivity-switching to change from a low resistance state to a high resistance state, which may be referred to as RESETTING the memory cell. Similarly, the memory cells can be programmed by applying one or more programming signals to cause the reversible resistivity-switching to change from the high resistance state to the low resistance state, which may be referred to as SETTING the memory cell.

Both unipolar and bipolar modes of operation of the cross-point memory arrays have been proposed. In bipolar operation, the high resistance state is established by applying a voltage having one polarity and the low resistance state is established by applying a voltage having the opposite polarity. In unipolar operation, the high resistance state and low resistance state are established by applying voltages of the same polarity.

Some memory arrays use a steering device in series with the reversible resistivity-switching element to control the current flow for SET and RESET operations. That is, with a cross-point memory array some memory cells are selected for programming or reading, whereas many others are unselected and therefore should not be programmed or read during the present operation. The steering element helps to control which memory cells get programmed or read during a given operation. An example of a steering element is a p-i-n diode placed in series with each reversible resistivity-switching element. With appropriate voltages applied to the bit lines and word lines, each memory element can be separately programmed and read. However, with a p-i-n diode unipolar switching may be preferable as reverse operation may damage the p-i-n diode. Also, unipolar operation may suffer from problems such as requirement a high RESET current.

Also, the switching yields for unipolar operation may be lower than the switching yields for bipolar operations. The switching yield refers to the percentage of memory cells that exhibit proper switching behavior. Since it is desirable to have high switching yields, it may be desirable to have memory cells that are compatible with bipolar switching.

One proposal for bipolar operation of cross-point memory arrays is to place a metal/insulator/metal (MIM) diode in series with the resistive memory cell. However, it can be difficult to fabricate MIM diodes having desirable properties such as a sufficiently high forward bias current.

BRIEF DESCRIPTION OF THE DRAWINGS

FIGS. 1C, 1D, and 1E are embodiments of carbon/tunneling-barrier/carbon diodes.

FIG. 2B depicts example energy band diagrams for one embodiment of a carbon/silicon interface under forward bias of a voltage (Vf).

FIG. 2C depicts example energy band diagrams for one embodiment of a carbon/silicon interface under reverse bias of a voltage (Vr).

DETAILED DESCRIPTION

A carbon/tunneling-barrier/carbon diode and method for forming the same are disclosed. In one embodiment, the carbon/tunneling-barrier/carbon diode is used as a steering element in a memory array. Each memory cell in the memory array may include a reversible resistivity-switching element and a carbon/tunneling-barrier/carbon diode as the steering element. In one embodiment, the state of the memory cells is switched using bipolar switching. However, unipolar switching may also be used.

The tunneling-barrier may include a semiconductor or an insulator. Thus, in one embodiment, the diode is a carbon/semiconductor/carbon diode. The semiconductor in the diode may be intrinsic or doped. In one embodiment, the semiconductor is depleted when the diode is under equilibrium conditions. For example, the semiconductor may be lightly doped such that the depletion region extends from one end of the semiconductor region to the other end under equilibrium conditions. In another embodiment, the semiconductor is not fully depleted in equilibrium. For example, with no bias or in unselected condition, the semiconductor is not fully depleted. However, the semiconductor becomes depleted under full bias in selected condition. In one embodiment, the diode is a carbon/insulator/carbon diode.

It may be desirable for the carbon in the diode to have low resistivity. In one embodiment, the carbon is primarily sp2 bonded carbon, which may lead to low resistivity. By primarily sp2 bonded carbon it is meant that at least 50% of the carbon forms an sp2 hybridized bond with one or more other carbon atoms. In one embodiment, the carbon is graphitic carbon, which may also lead to low resistivity. In one embodiment, the carbon is doped. Doping the carbon may also be used to lower the carbon's resistivity.

Figure 1A:
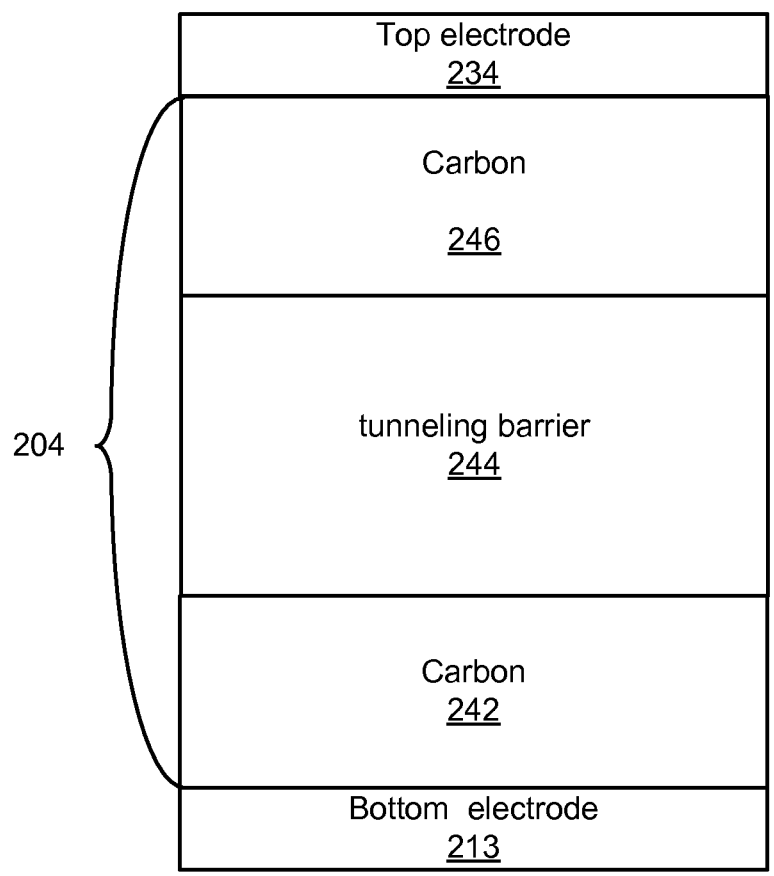
FIG. 1A is a diagram of a carbon/tunneling-barrier/carbon diode.

FIG. 1A is a diagram of a carbon/tunneling-barrier/carbon diode 204 with electrodes. The diode 204 includes tunneling-barrier 244 between a first carbon region 242 and a second carbon region 246. Also depicted are a bottom electrode 213 below the diode 204 and a top electrode 234 above the diode 204. In one embodiment, the tunneling-barrier 244 includes at least one semiconductor. In one embodiment, the tunneling-barrier 244 includes at least one insulator.

The carbon in the first carbon region 242 and in the second carbon region 244 includes elemental carbon. In one embodiment, the first and second regions 242, 246 include primarily elemental carbon. By primarily elemental carbon it is meant that at least 50% of the atoms in the first carbon region 242 and the second carbon region 246 are elemental carbon. Note that some impurities such as, but not limited to, dopants may be present in the carbon regions 242, 246. One example of elemental carbon is graphite; however, the carbon regions 242, 246 are not limited to graphitic carbon. In one embodiment, the carbon regions 242, 244 include elemental carbon that is primarily sp2 bonded carbon. As used herein, the term "sp2 bonded carbon" refers to carbon forming sp2 bonds with other carbon atoms. For example, one s-orbital and two p-orbitals may undergo an sp2 hybridization to form sp2 bonded carbon. By "primarily sp2 bonded carbon" it is meant that at least 50% of the carbon is sp2 bonded carbon. Note that some of the carbon could be sp3 bonded carbon.

It may be desirable for the carbon in the diode to have low resistivity. As mentioned, in some embodiments the carbon is primarily sp2 bonded carbon, which may lead to low resistivity. In one embodiment, the carbon is doped. Doping the carbon may lower the carbon's resistivity. Example dopants include, but are not limited to, boron and nitrogen.

The top electrode 234 and bottom electrode 213 provide physical and electrical contact between the diode 204 and other elements. For example, the diode 204 could be placed in series with a memory element in which case one of the electrodes 213, 234 resides between the diode 204 and the memory element. Example materials for the bottom and top electrodes 213, 234 include, but are not limited to, titanium, titanium nitride, tantalum, tantalum nitride, tungsten, tungsten nitride, copper, and aluminum.

As one example, the thicknesses of the diode regions may be as follows: carbon region 242: 10 nanometers (nm), tunneling-barrier 244: 50 nm carbon region 246: 10 nm.

Figure 1B:
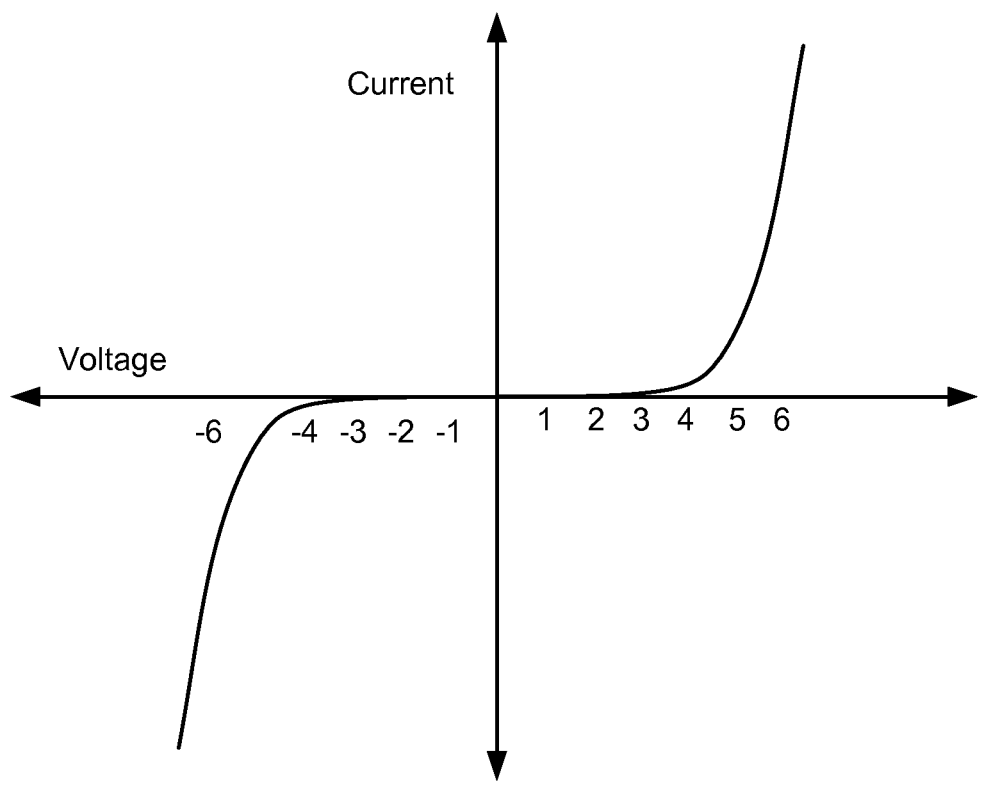
FIG. 1B depicts an example current-voltage relationship for one embodiment of a carbon/tunneling-barrier/carbon diode.

FIG. 1B depicts an example current-voltage relationship for one embodiment of a carbon/tunneling-barrier/carbon diode 204. Note that the current-voltage relationship is highly non-linear in this example. For some applications, high non-linearity is desirable. One parameter of interest is the "k factor," which is defined as the ratio of the current at a nominal voltage to the current at one half the nominal voltage. A high k-factor (which corresponds to high non-linearity) is desirable for some applications. As one example, high non-linearity (or high k-factor) may be desirable when using the diode as a steering element in a cross-point memory array. The thickness of the tunneling-barrier 244 is a parameter that can be adjusted to influence the shape of the current-voltage relationship of the diode. Adjusting the thickness to influence the shape of the current-voltage relationship of the diode will be discussed below.

FIGS. 1C, 1D, and 1E are different embodiments of carbon/tunneling-barrier/carbon diodes. Specifically, whereas FIG. 1A depicts a general tunneling-barrier 244, different types of materials for tunneling-barriers 244 are depicted in FIGS. 1C, 1D, and 1E. FIG. 1C is a diagram of one embodiment of a carbon/semiconductor/carbon diode. In this embodiment, the semiconductor 244a may serve as a tunneling-barrier 244. Example semiconductors include but are not limited to, silicon and germanium. The semiconductor 244a could include more than one type of semiconductor. For example, semiconductor 244a may be formed from a polycrystalline silicon, polycrystalline silicon-germanium alloy, polygermanium or any other suitable combination of semiconductors.

In one embodiment, the semiconductor 244a is not intentionally doped (e.g., the semiconductor is intrinsic). In one embodiment, the semiconductor 244a is doped. The doping may be relatively light. An example doping concentration is about $7.0 \times 10^{17}/cm^3$. In one embodiment, the doping concentration is such that, under equilibrium conditions, the semiconductor 244a is depleted from one end to the other. That is, the semiconductor 244a is depleted from one carbon/semiconductor junction to the other carbon/semiconductor junction.

Note that the doping semiconductor 244a does not need to be uniform. In some embodiments, the doping concentration is graded. By graded it is meant that the concentration of the dopant is different in different locations in semiconductor region 244. Typically, the concentration is different at different distances from the carbon regions 242, 246. Note that the concentration might be heavier near one carbon region (e.g., carbon region 246) and lighter near the other (e.g., carbon 242). In one embodiment, the semiconductor 244a is doped with both n- and p-type donors. For example, an n-type dopant might be used near carbon region 242, whereas a p-type dopant might be used near carbon region 246.

In one embodiment, the tunneling-barrier 244 is divided into regions that include different types of semiconductors. For example, one region includes silicon and another includes germanium. In the embodiment of FIG. 1D, the tunneling-barrier 244 includes a first germanium region 244a(1), a silicon region 244a(2), and a second germanium region 244a(3). Note that other combinations of semiconductors could be used.

FIG. 1E is a diagram of one embodiment of a carbon/insulator/carbon diode. In one embodiment, the insulator 244b may serve as a tunneling-barrier 244. Example insulators include, but are not limited to, silicon dioxide, silicon nitride, silicon carbide, aluminum oxide, aluminum silicon oxide, hafnium oxide, hafnium silicon oxide, and titanium oxide. Note that some materials could be considered to be either a semiconductor or an insulator. For example, silicon carbide might be considered to be either a semiconductor or an insulator.

Figure 2A:
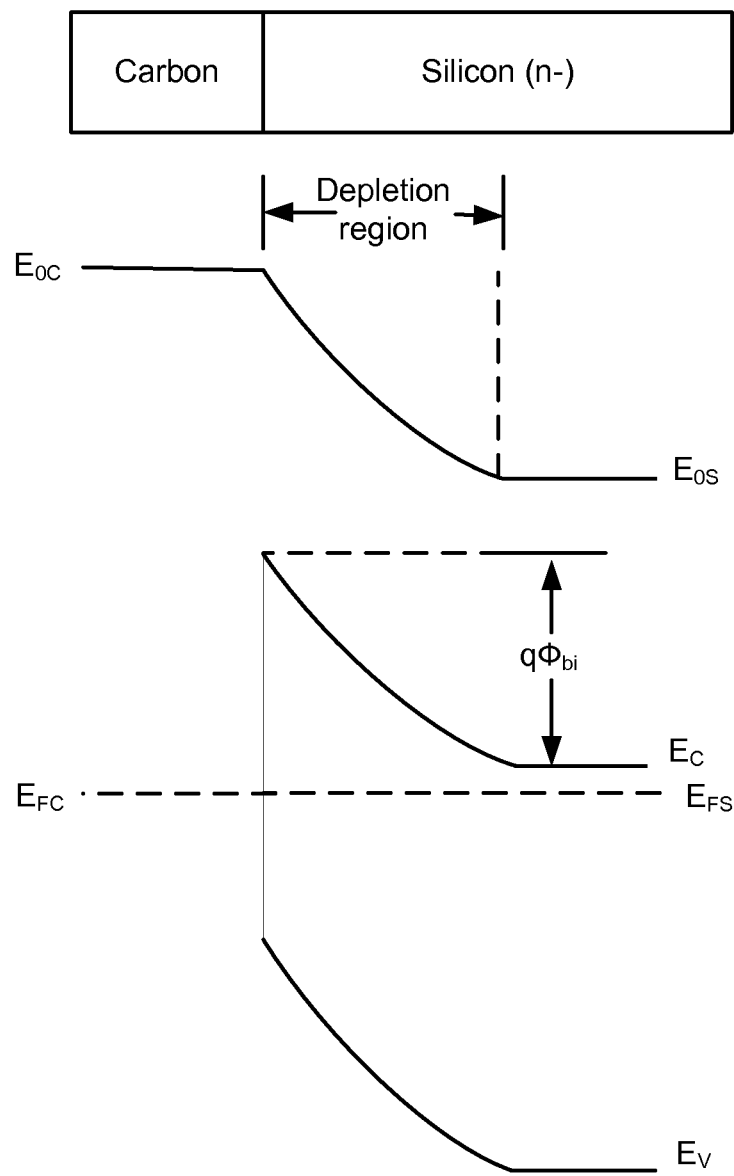
FIG. 2A depicts an example energy band diagram a carbon/silicon interface at thermal equilibrium.

As mentioned, the tunneling-barrier 244 may include silicon or one or more other semiconductors. Thus, in some embodiments, the diode 204 has a carbon/silicon interface. Some of the properties of carbon/silicon interface will now be discussed in connection with FIGS. 2A-2C. The silicon is lightly n-doped in the examples in FIG. 2A-2C. Note that doping is not a requirement and that p-doping may be used. FIG. 2A depicts an example energy band diagram a carbon/silicon interface at thermal equilibrium. Depicted are the vacuum levels of the silicon ($E_{OS}$) and the carbon ($E_{OC}$), the conduction level ($E_C$) of the silicon, the valence level ($E_V$) of the silicon and Fermi levels of the carbon ($E_{FC}$) and silicon ($E_{FS}$). At thermal equilibrium, the Fermi levels of the silicon ($E_{FS}$) and carbon ($E_{FC}$) and are equal. Because carbon has a higher work function than silicon, there is a certain amount of band banding at thermal equilibrium, as depicted by the depletion region in the silicon. Also note that at equilibrium there is a built-in potential $\Phi_{bi}$. In this example, the built in potential refers to how far the conduction band of the silicon ($E_C$) has been bent down. As will be discussed below, the built-in potential impacts charge carrier flow, and hence the diode current.

In FIG. 2A, the depletion region is depicted as extending part way across the silicon region. Note that for a diode 204 such as the embodiment depicted in FIG. 1C, both sides of the semiconductor region 244 will have an interface with a carbon region 242, 246. Therefore a depletion region may arise at each interface. In one embodiment, the depletion region extends entirely across the semiconductor region when the diode 204 is under thermal equilibrium. In other words, the depletion regions due to each carbon/silicon interface reach each other. In some embodiments, the semiconductor is lightly doped such that the depletion region extends from one end of the semiconductor region to the other end. As previously mentioned, an example doping concentration is about $7.0 \times 10^{17}/cm^3$.

FIG. 2B depicts example energy band diagrams for one embodiment of a carbon/silicon interface under forward bias of a voltage (Vf). Under forward bias, electrons may flow from the lightly n-doped silicon to the carbon. In general, current flow may be due to majority carrier injection from the silicon. The barrier ($q(\Phi_b - Vf)$) that is created by the unequal work functions of the carbon and silicon impacts current flow. In some embodiments, forward current flow is governed by thermionic emission over the barrier.

FIG. 2C depicts example energy band diagrams for one embodiment of a carbon/silicon interface under reverse bias of a voltage (Vr). Note that the barrier height for the reverse bias case ($q(\Phi_b - Vr)$) is greater than the barrier height for the forward bias case. Under reverse bias, electrons may flow from the carbon to the lightly n-doped silicon. In general, reverse current flow may be due to leakage charge generation and tunneling by those charge carriers that are able to overcome the barrier. Note that the length of the depletion region may grow for the junction under reverse bias, but may shrink for the junction under forward bias.

As previously mentioned, the depletion regions from each carbon/silicon junction may overlap. In some embodiments, the depleted silicon region causes the carbon/silicon/carbon diode 204 to resemble a tunnel junction with the silicon being a tunneling-barrier and the carbon contacts on both sides acting as a metallic contact. A tunneling-barrier 244 formed from silicon may be present a relatively low barrier to current flow. For example, the barrier may be about 0.5 eV for a carbon/silicon interface. However, the barrier may be higher or lower depending on material choice. For example, a wide variety of semiconductors or insulators can be used in the tunneling-barrier 244. Thus, note that while an example of a silicon/carbon interface was used for purposes of discussion, the diode 204 is not limited to silicon for the tunneling-barrier 244. Also note that embodiments of the diode 204 in which the tunneling-barrier 244 is a semiconductor other than silicon or an insulator may also resemble a tunnel junction.

Considering that, in some embodiments, the diode 204 may act as a tunnel junction, the diode 204 current may include a first current component that is due to direct tunneling through the tunneling-barrier 244 and second current component that is due to Fowler-Nordheim emission through the tunneling-barrier 244. The direct tunneling current may be fairly sensitive to the thickness of the tunneling-barrier 244. For example, a thicker tunneling-barrier 244 may result in a lower direct tunneling current. On the other hand, changes to the thickness of the tunneling-barrier 244 may have less impact on the magnitude of the current due to Fowler-Nordheim emission. However, the voltage applied across the diode 204 may impact Fowler-Nordheim emission. For example, the current due to Fowler-Nordheim emission may increase as the applied voltage increases. Thus, at lower voltages, the diode current may be influenced primarily by the direct tunneling current. On the other hand, at higher voltages, the diode current may be influenced primarily by Fowler-Nordheim emission.

Figure 3A:
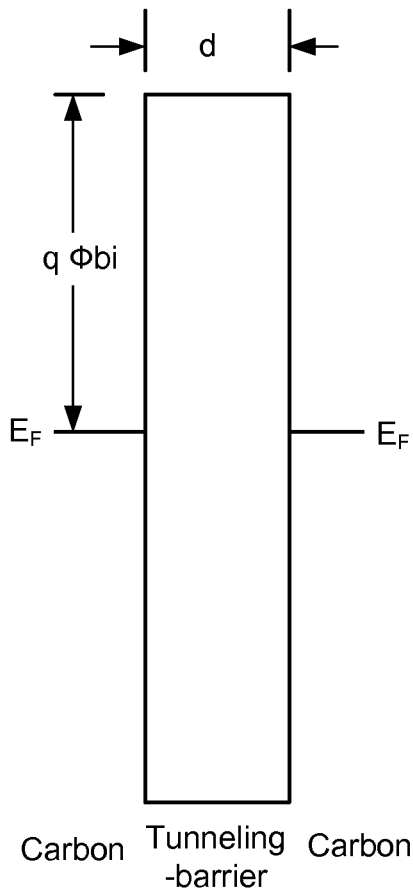
FIGS. 3A and 3B depict example energy band diagrams for one embodiment of a carbon/tunneling-barrier/carbon diode.
Figure 3B:
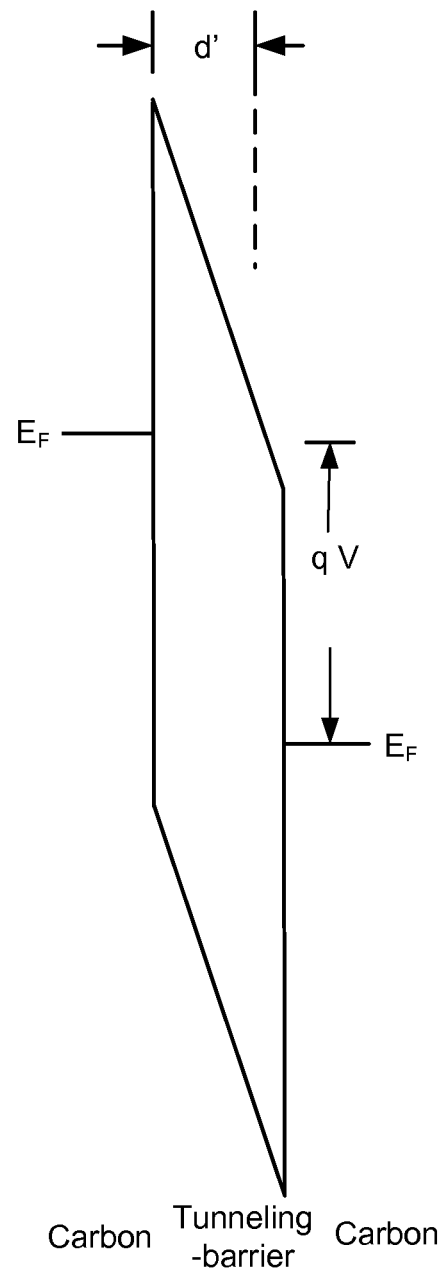

FIGS. 3A and 3B depict example energy band diagrams for one embodiment of a carbon/tunneling-barrier/carbon diode. Note that the tunneling-barrier 244 may be a semiconductor or an insulator in this case. FIGS. 3A-3B are used to provide one possible explanation for the current flow in the diode 204. However, note that the energy band diagrams in FIGS. 3A and 3B are for purposes of illustration and it is not required that the diode 204 have such energy bands. FIG. 3A depicts an example in which there is no applied voltage. The barrier height above the Fermi level ($E_F$) is represented by $q\Phi bi$. The barrier height impact current flow.

FIG. 3B depicts the case in which the applied voltage is greater than the work function $\Phi bi$. Note how the effective thickness (d') of the barrier region is reduced by the application of the voltage (V). For one embodiment, when the applied voltage is less than the work function $\Phi bi$, the diode current is primarily due to direct tunneling and when the applied voltage is greater than the work function $\Phi bi$, the diode current is primarily due to Fowler-Nordheim emission.

As previously mentioned, by adjusting the thickness of the tunneling-barrier 244, the relative contribution of the direct tunneling current and Fowler-Nordheim emission can be adjusted. Therefore, the amount of non-linearity (or the k-factor) may be adjusted. For example, making the tunneling-barrier 244 thicker may decrease current due to direct tunneling. Therefore, the shape of the current-voltage relationship may be controlled by adjusting the thickness of the tunneling-barrier 244.

Example Memory Cell and System

Figure 4A:
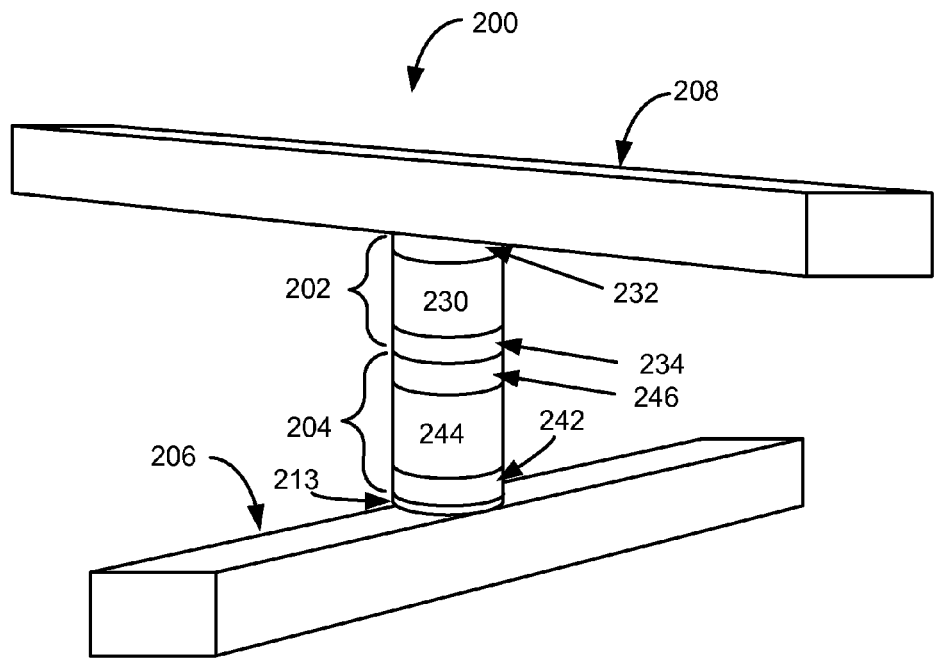
FIG. 4A is a simplified perspective view of one embodiment of a memory cell.

As previously mentioned, one use of some embodiments of a carbon/tunneling-barrier/carbon diode 204 is as a steering element in a memory array. Typically, to act as a steering element, one diode 204 is connected electrically in series with one memory element. FIG. 4A is a simplified perspective view of one embodiment of a memory cell 200 which includes a reversible resistivity-switching element 202 coupled in series with a steering element 204 between a first conductor 206 and a second conductor 208. The memory element 202 includes a reversible resistivity switching material 230, a memory element upper electrode 232, and a memory element lower electrode 234. Note that the memory element lower electrode 234 may serve as the upper electrode for the diode 204. The memory cell 200 may have other layers that are not depicted in FIG. 4A.

Any of the example carbon/tunneling-barrier/carbon diodes 204 described herein may be used for the steering element 204. It will be understood that the carbon/tunneling-barrier/carbon 204 described herein are for purposes of illustration. Therefore, the steering element 204 is not limited to the example carbon/tunneling-barrier/carbon 204 described herein.

Reversible resistivity-switching element 202 includes reversible resistivity-switching material 230 having a resistance that may be reversibly switched between two or more states. In one embodiment, the reversible resistivity-switching material 230 is resistance change memory (ReRAM). In one embodiment, the reversible resistivity-switching material 230 is phase change memory (PCRAM). However, the reversible resistivity-switching material 230 is not limited to ReRAM or to PCRAM.

The reversible resistivity-switching material 230 may be in an initial high-resistance state upon fabrication that is switchable to a low-resistance state upon application of a first physical signal. For example, the device may switch states in response to application of a first amount of energy, charge, heat, voltage, current or other phenomena. Application of a second amount of energy, charge, heat, voltage, current or other phenomena may return the reversible resistivity-switching material 230 to the high-resistance state. Alternatively, the reversible resistivity-switching material 230 may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used. Numerous reversible resistivity-switching materials and operation of memory cells employing reversible resistivity-switching materials are described, for example, in U.S. Patent Application Publication 2006/0250836, previously incorporated.

In one embodiment, the process of switching the resistance from the high-resistance state to the low-resistance state is referred to as SETTING the reversible resistivity-switching element 202. The process of switching the resistance from the low-resistance state to the high-resistance state is referred to as RESETTING the reversible resistivity-switching element 202. The high-resistance state may be associated with binary data "0" and the low-resistance state is associated with binary data "1." In other embodiments, SETTING and RESETTING and/or the data encoding can be reversed.

In some embodiments, reversible resistivity-switching material 230 may be formed from a metal oxide. Various different metal oxides can be used. More information about fabricating a memory cell using reversible resistivity-switching material can be found in United States Patent Application Publication 2009/0001343, filed on Jun. 29, 2007, entitled "Memory Cell that Employs a Selectively Deposited Reversible Resistance Switching Element and Methods of Forming the Same," which is hereby incorporated herein by reference in its entirety. Note that the reversible resistivity-switching material 230 is not limited to being a metal oxide.

Reversible resistivity-switching element 202 includes electrodes 232 and 234. Electrode 232 is positioned between reversible resistivity-switching material 230 and conductor 208. Note that the relative positions of the diode 204 and the memory element 202 could be reversed. For example, the diode 204 could be above the memory element 202. Electrode 234 is positioned between reversible resistivity-switching material 230 and diode 204. The memory element upper 232 and lower electrodes 234 may be formed from materials including but not limited to, titanium, titanium nitride, tantalum, tantalum nitride, tungsten, and tungsten nitride.

Conductors 206 and 208 may include any suitable conductive material such as tungsten, any appropriate metal, heavily-doped semiconductor material, a conductive silicide, a conductive silicide-germanide, a conductive germanide, or the like. In the embodiment of FIG. 4A, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

Figure 4B:
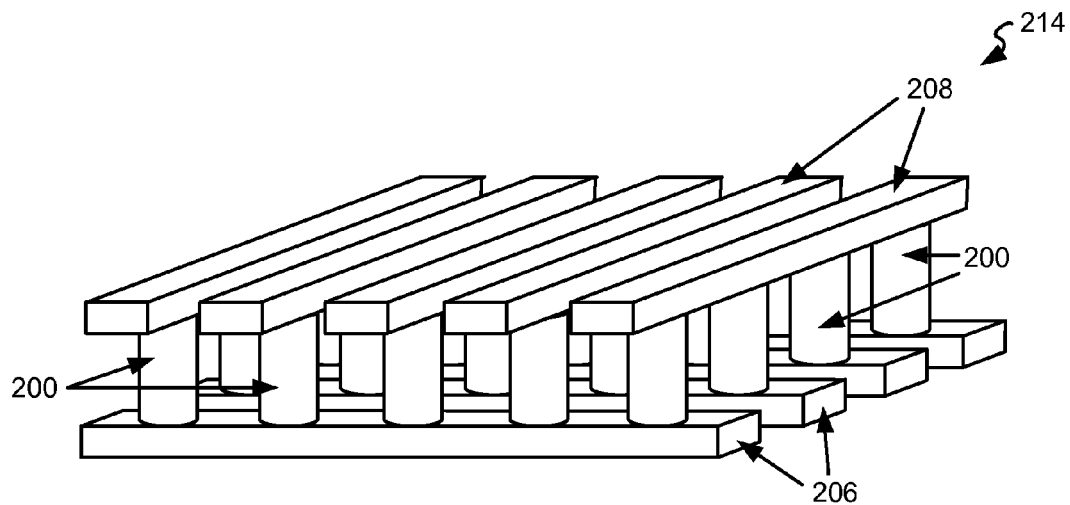
FIG. 4B is a simplified perspective view of a portion of a first memory level formed from a plurality of the memory cells of FIG. 4A.

FIG. 4B is a simplified perspective view of a portion of a first memory level 214 formed from a plurality of the memory cells 200 of FIG. 4A. For simplicity, the reversible resistivity-switching element 202 and the diode steering element 204 are not separately shown. The memory array 214 is a "cross-point" array including a plurality of first conductors 206 (e.g., bit lines) and a plurality of second conductors 208 (e.g., word lines) between which multiple memory cells are coupled (as shown). Other memory array configurations may be used, as may multiple levels of memory.

Figure 4C:
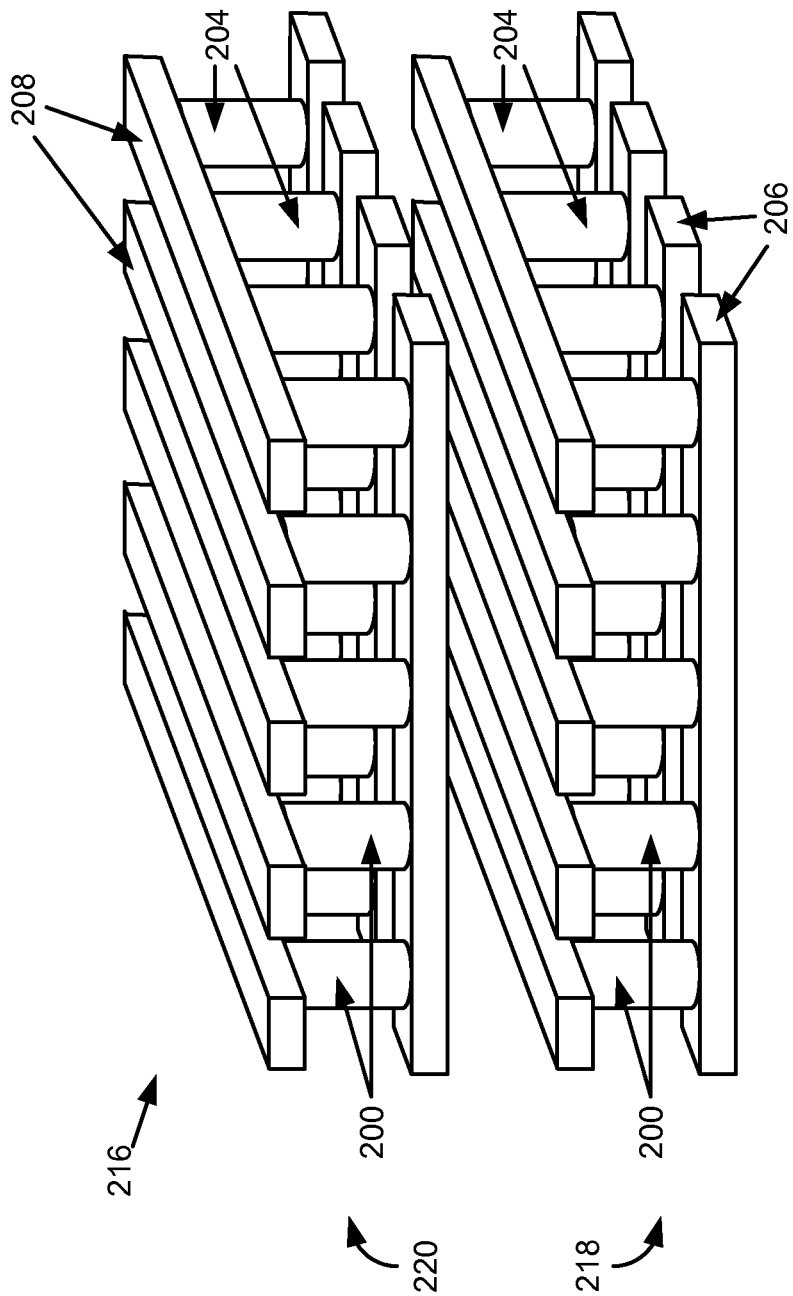
FIG. 4C is a simplified perspective view of a portion of a monolithic three dimensional array that includes a first memory level positioned below a second memory level.

FIG. 4C is a simplified perspective view of a portion of a monolithic three dimensional array 216 that includes a first memory level 218 positioned below a second memory level 220. In the embodiment of FIG. 4C, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4C for simplicity. Other memory array configurations may be used, as may additional levels of memory.

Figure 4D:
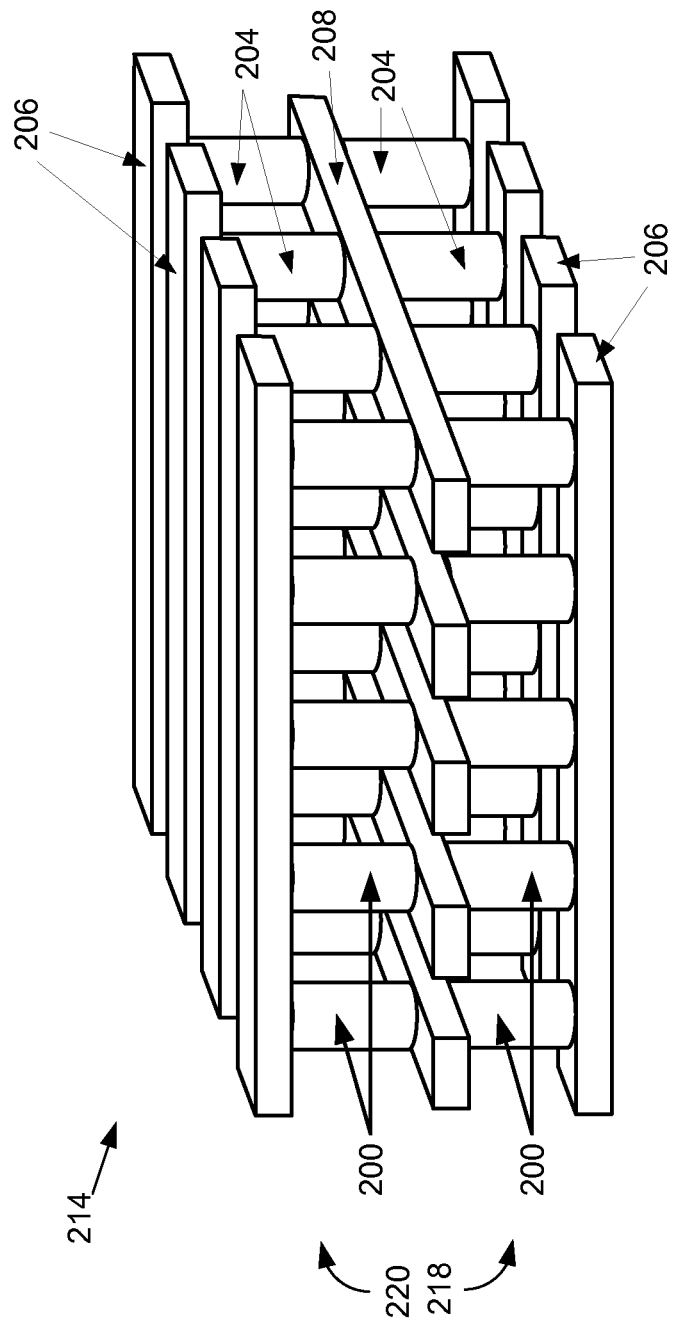
FIG. 4D is a simplified perspective view of a portion of a three dimensional array that includes a first memory level positioned below a second memory level.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 4D.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 4,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 4A-4D show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377.

Figure 4E:
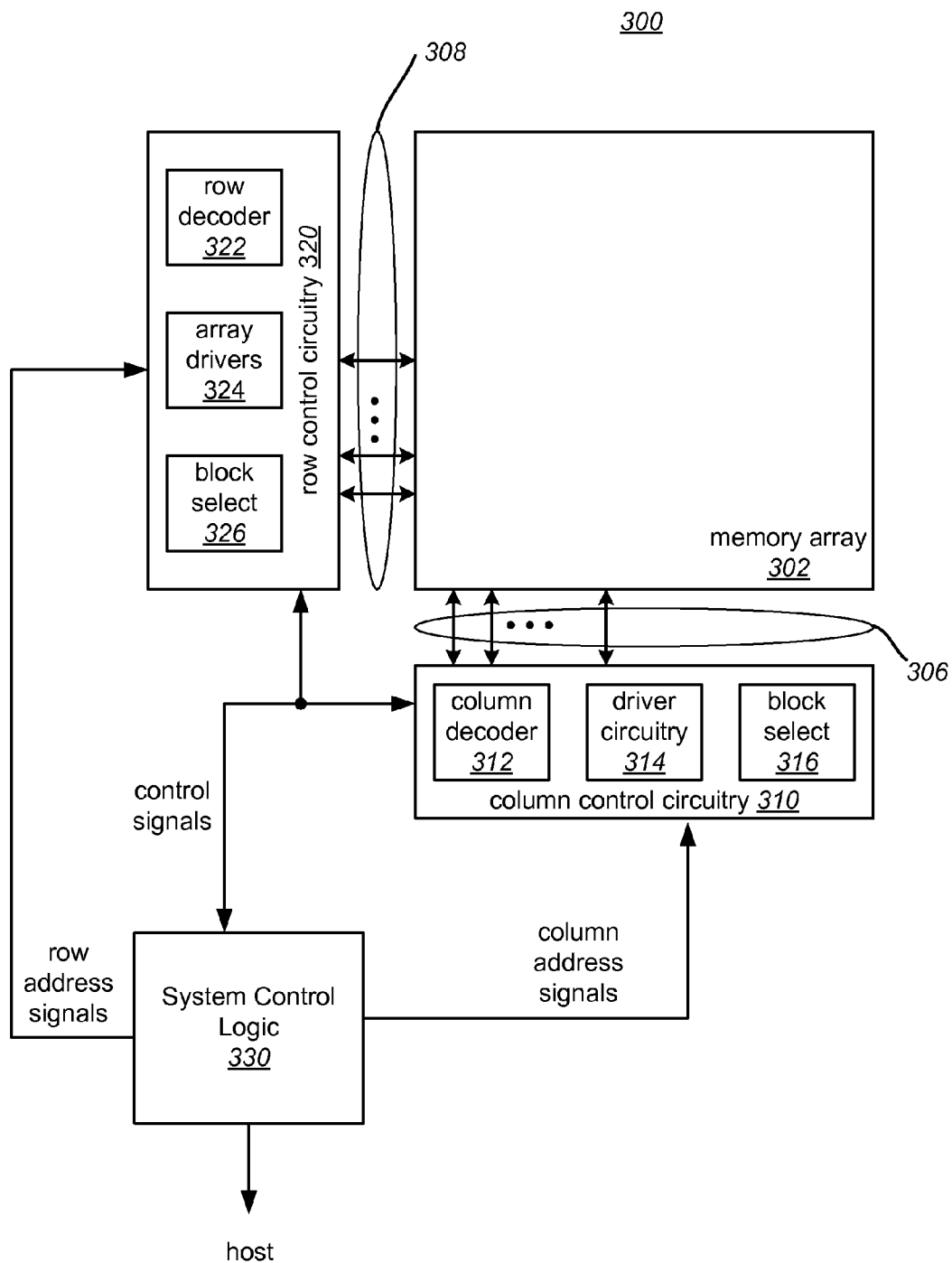
FIG. 4E is a block diagram of one embodiment of a memory system.

FIG. 4E is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

In one embodiment, all of the components depicted in FIG. 4E are arranged on a single integrated circuit. For example, system control logic 330, column control circuitry 310 and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

Figure 5:
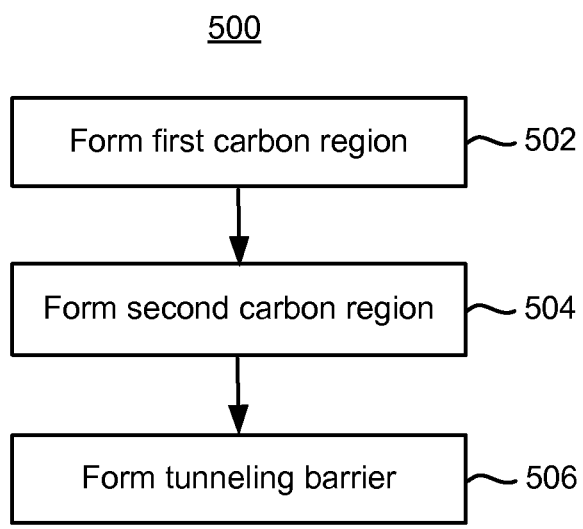
FIG. 5 shows a process of one embodiment of forming a carbon/tunneling-barrier/carbon diode.

FIG. 5 shows a process 500 of one embodiment of forming a carbon/tunneling-barrier/carbon diode 204. Process 500 may be used to form a diode 204 such as depicted in any of FIG. 1A, 1C, 1D, or 1E, but is not limited to such embodiments. In step 502, a first region of carbon 242 is formed. In one embodiment, the first region includes primarily elemental carbon. By primarily elemental carbon it is meant that at least 50% of the atoms in the first region are elemental carbon. In one embodiment, the elemental carbon in the first region includes primarily sp2 bonded carbon. By primarily sp2 bonded carbon it is meant that at least 50% of the carbon in the first region is sp2 bonded carbon. In one embodiment, the carbon in the first region is doped with an impurity such as boron or nitrogen. Doping of the carbon may be in situ or by implant.

In one embodiment, forming the first carbon region 242 includes depositing amorphous carbon and later performing a thermal anneal to cause the amorphous carbon to include primarily sp2 bonded carbon. Example parameters for the thermal anneal is a rapid thermal anneal (RTA) at 700 C for 60 seconds. In one embodiment, amorphous carbon is deposited in a plasma enhanced chemical vapor deposition (PECVD) chamber using $C_2H_2$ gas at 550 C and at 5 Torr pressure. As deposited, the amorphous carbon may exhibit relatively high resistivity. The resistivity of the carbon may be lowered by increasing the amount of sp2 bonded carbon. Note that the resistivity may depend on the thickness of the carbon. In one embodiment, the thickness of the carbon is about 100 Angstoms, which may provide for acceptable resistivity and a reproducible film thickness. Note that the carbon film may be thicker or thinner than 100 Angstoms. For example, the carbon film could be made thinner than 100 Angstoms to lower the resistivity. Note that the thermal anneal may take place after other steps of process 500.

In step 504, a second region that includes carbon is formed. Step 504 is similar to step 502. In one embodiment, the second region includes primarily elemental carbon. In one embodiment, the elemental carbon in the second region includes primarily sp2 bonded carbon. In one embodiment, forming the second carbon region 242 includes depositing amorphous carbon and then performing a thermal anneal to cause the amorphous carbon to form sp2 bonded carbon. In one embodiment, the carbon in the second region is doped with an impurity such as boron or nitrogen. Note that step 504 does not necessarily directly follow step 502.

In step 506, a third region that includes at least one material that provides a tunneling-barrier between the first region and the second region is formed. Note that the third region may be formed prior to forming the second carbon region 246. The material in the third region could include at least one semiconductor such as silicon, germanium, or a combination of silicon and germanium. The third region might include a silicon-germanium alloy or separate silicon and germanium regions. The semiconductor may be undoped or lightly doped. In one embodiment, at equilibrium the at least one semiconductor is depleted. In one embodiment, the at least one semiconductor has a first portion near the first region that includes a p-type dopant and a second portion near the second region that includes an n-type dopant. In one embodiment, the at least one material that provides a tunneling-barrier includes an insulator. For example, at least one material that provides a tunneling-barrier may include one or more of silicon carbide, silicon dioxide, silicon nitride, aluminum oxide, hafnium oxide, hafnium silicon oxide, aluminum silicon oxide, or titanium oxide Note that order in which the steps of process 500 are recited is not a requirement. Also some steps of process 500 may take place at different times, such that at least a portion of another step takes place prior to completing the other step.

Figure 6:
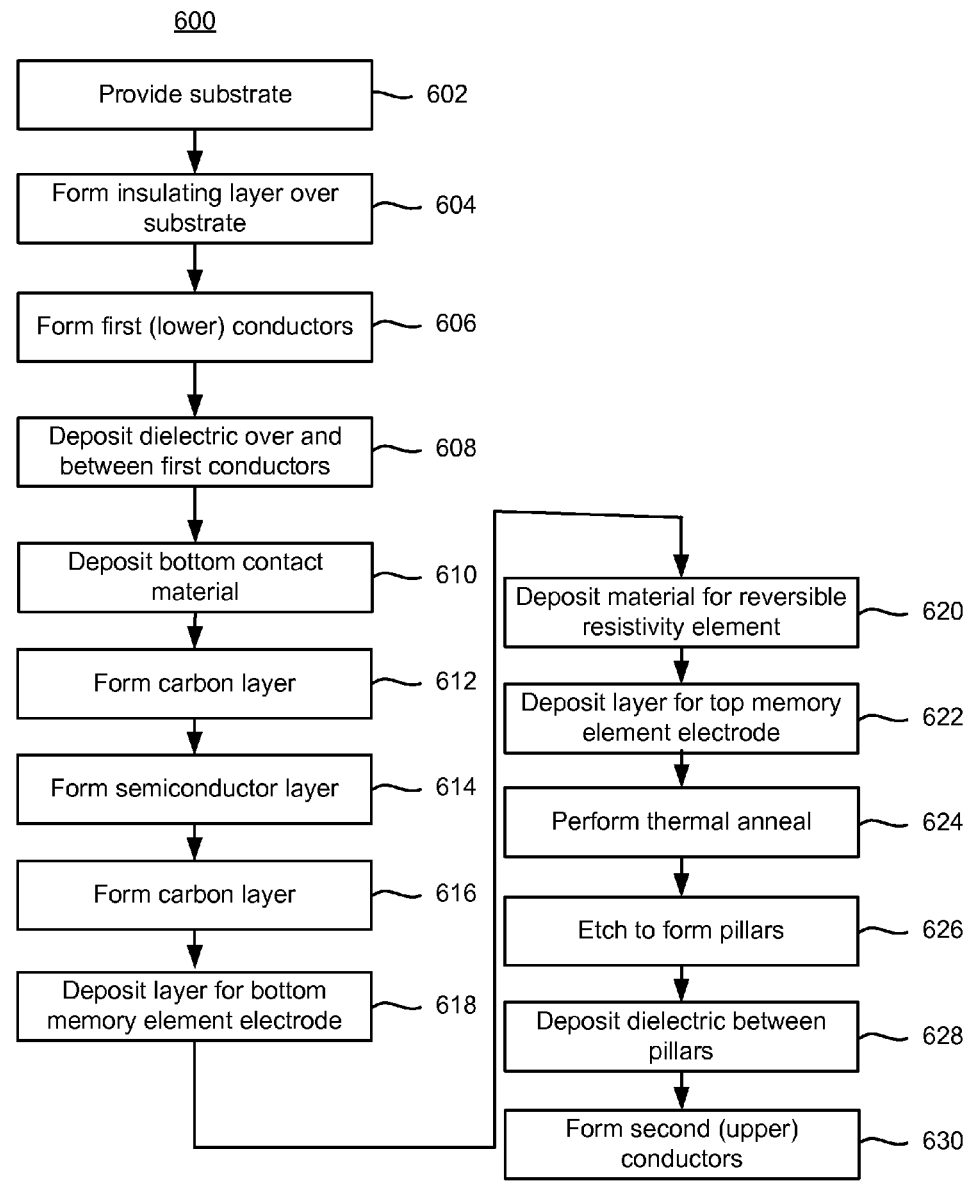
FIG. 6 is a flowchart of one embodiment of a process of forming a memory array that uses carbon/tunneling-barrier/carbon diodes as steering elements.

FIG. 6 is a flowchart of one embodiment of a process 600 of forming a memory array that uses carbon/tunneling-barrier/carbon diodes 204 as steering elements. Process 600 may be used to form a memory array such as memory array 214 depicted in FIG. 4B. Formation of the memory array 214 begins with providing a substrate in step 602. The substrate can be any semiconducting substrate known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein. For example, the substrate may include circuits that are electrically connected to the conductors 206, 208 in order to read and program the memory array. In step 604, an insulating layer is formed over substrate. The insulating layer can be silicon oxide, silicon nitride, or any other suitable insulating material.

In step 606, first (or lower) conductors 206 are formed over the insulator. Step 606 may includes depositing a material for first conductors 206 over the insulator. An adhesion layer may be included between the insulating layer and the conducting layer to help the conducting layer adhere to the insulating layer. If the overlying conducting layer is tungsten, titanium nitride may be used as an adhesion layer. The conducting layer may comprise any conducting material known in the art, such as tungsten, or other materials, including tantalum, titanium, copper, cobalt, or alloys thereof. Once all the layers that will form the first conductors 206 have been deposited, the layers are patterned and etched using any suitable masking and etching process to form substantially parallel, substantially coplanar conductors 206. In one embodiment, photoresist is deposited, patterned by photolithography and the layers etched, and then the photoresist removed using standard process techniques.

Figure 7B:
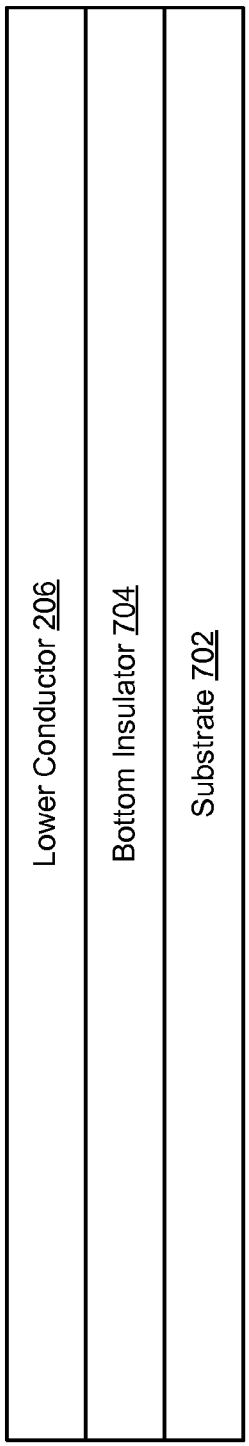
FIGS. 7A-7F depict results of forming the memory array after various steps in the process of FIG. 6.
Figure 7A:
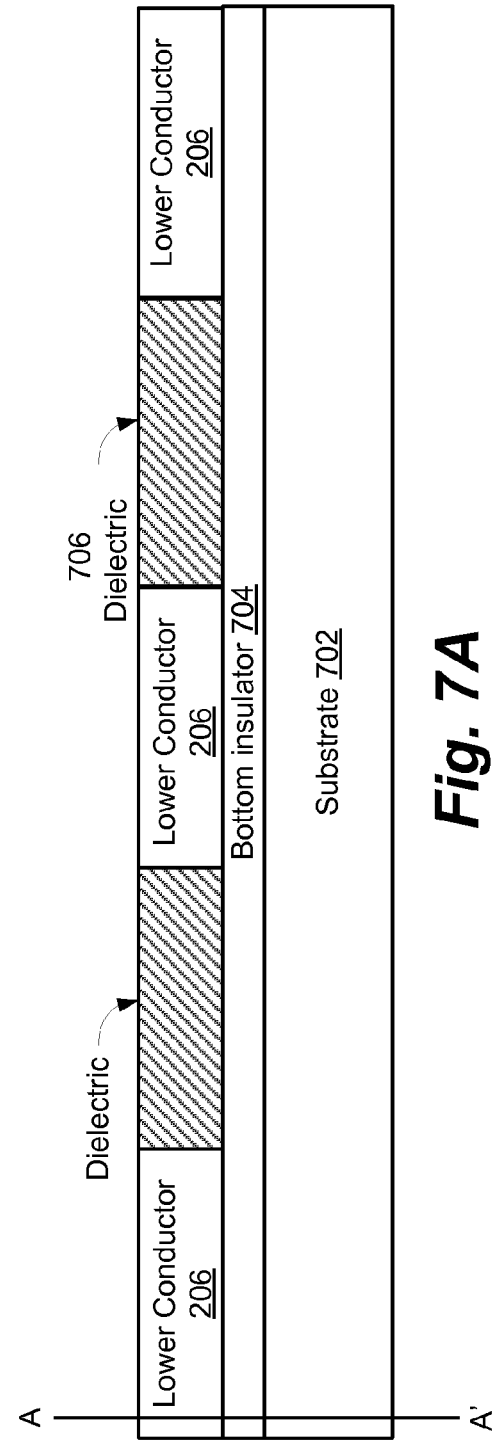

Next, in step 608, a dielectric material is deposited over and between first conductors 206. The dielectric material can be any known electrically insulating material, such as silicon oxide, silicon nitride, or silicon oxynitride. In one embodiment, silicon dioxide deposited by a high-density plasma method is used as dielectric material. Excess dielectric material on top of first conductors 206 may be removed, exposing the tops of first conductors 206 separated by dielectric material, and leaving a substantially planar surface. This removal of dielectric overfill to form the planar surface can be performed by any process known in the art, such as chemical mechanical polish (CMP) or planarization etchback. In an alternative embodiment, first conductors 206 could be formed by a Damascene method. FIGS. 7A and 7B depict results after step 608. FIG. 7A shows first (lower) conductors 206 residing over a substrate 702 and bottom insulator 704 with dielectric 706 between the first conductors 206. FIG. 7B shows a cross section taken along line A-A' of FIG. 7A.

In step 610, a layer of material that will be used for diode electrodes 213 is deposited at least over the bottom conductors 206. Step 610 may include depositing a layer of TiN over the bottom conductors 206 and the dielectric 706 that resides between the conductors 206. However, diode electrode 213 can be formed from another material such as titanium, titanium nitride, tantalum, tantalum nitride, tungsten, tungsten nitride, copper, and aluminum.

In steps 612, 614, and 618, layers of material that will be patterned into pillars for the carbon/tunneling-barrier/carbon diodes 204 are deposited. For purposes of discussion, an example in which the tunneling-barrier region 244 is a lightly doped semiconductor will be discussed. However, it will be appreciated that the tunneling-barrier could be an insulator. Also, the tunneling-barrier region 244 does not need to be doped.

In step 612 a layer of carbon that will serve as carbon regions 242 is deposited. In one embodiment, step 612 includes depositing amorphous carbon. In one embodiment, amorphous carbon is deposited in a plasma enhanced chemical vapor deposition (PECVD) chamber using $C_2H_2$ gas at 550 C and at 5 Torr pressure. In one embodiment, the thickness of the carbon is about 100 Angstoms, which may provide for acceptable resistivity and a reproducible film thickness. Note that the carbon film may be thicker or thinner than 100 Angstoms. In one embodiment, the layer of carbon is doped with a material such as boron or nitrogen. The doping may be in situ or by implant after the layer of carbon has been deposited.

In step 614, one or more layers of at least one semiconductor that will server as tunneling barriers 214 is formed over the layer of carbon. For purposes of discussion, silicon will be used as an example semiconductor. In one embodiment, in situ doping is performed while depositing the silicon. For example, during deposition of the silicon, a gas providing n-type or p-type dopant atoms is provided. However, in situ doping is not required. In one embodiment, after depositing a layer of silicon doping is performed. For example, an ion implant may be performed after depositing a layer of silicon. An example doping concentration is about $7.0 \times 10^{17}/cm^3$. Note that multiple layers of semiconductors could be deposited such as depositing a layer of silicon, depositing a layer of germanium, and depositing a layer of silicon. Also note that a layer of silicon-germanium alloy, polygermanium or any other suitable combination of semiconductors could be deposited in step 614. In an alternative embodiment, an insulator that is to serve as the tunneling barrier 214 is formed in step 614.

Figure 7C:
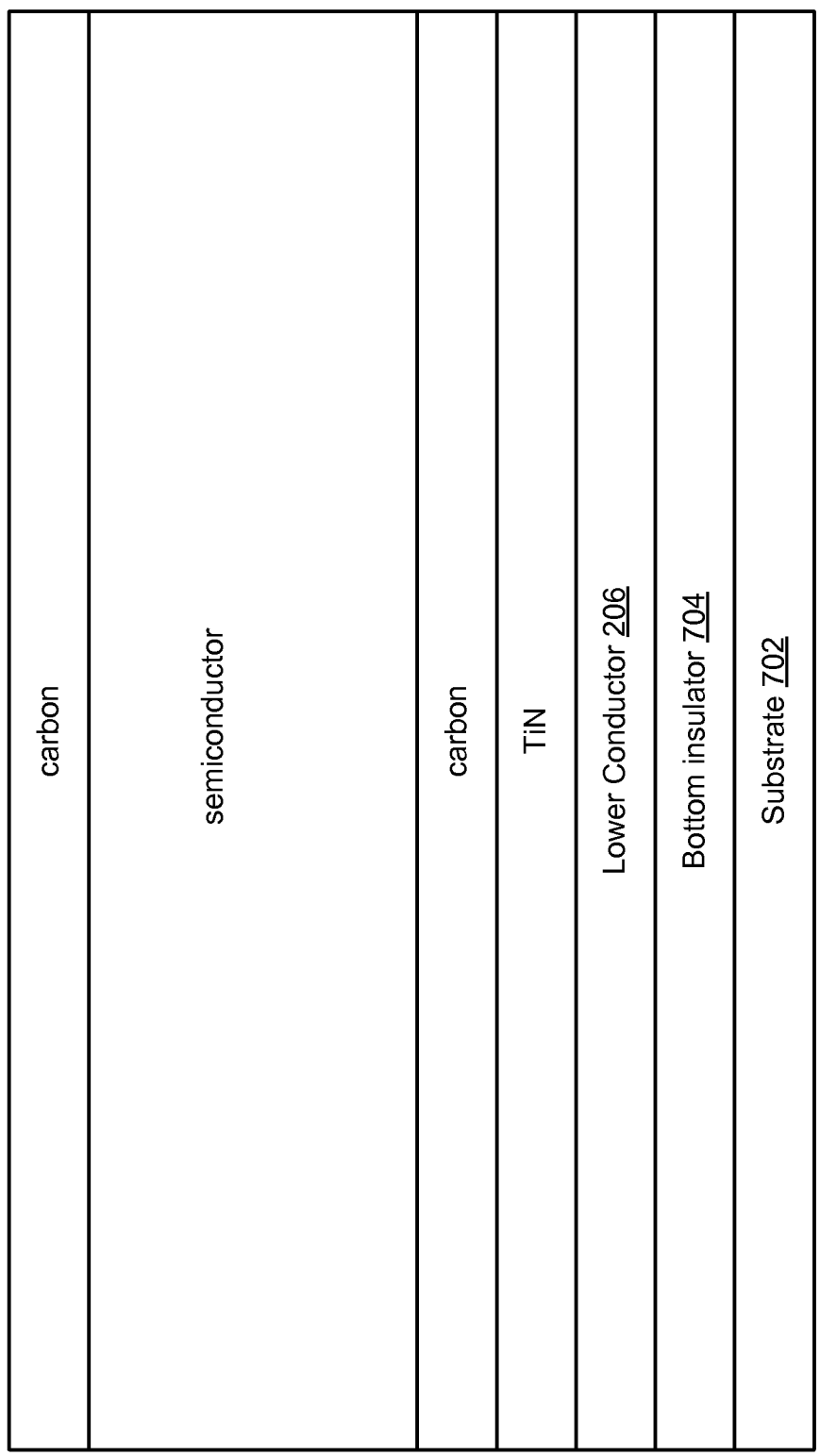

In step 616, another layer of carbon that will serve as carbon regions 246 is deposited. In one embodiment, step 616 includes depositing amorphous carbon. In one embodiment, amorphous carbon is deposited in a plasma enhanced chemical vapor deposition (PECVD) chamber using $C_2H_2$ gas at 550 C and at 5 Ton pressure. In one embodiment, the thickness of the carbon is about 100 Angstoms, which may provide for acceptable resistivity and a reproducible film thickness. Note that the carbon film may be thicker or thinner than 100 Angstoms. In one embodiment, the layer of carbon is doped with a material such as boron or nitrogen. The doping may be in situ or by implant after the layer of carbon has been deposited. FIGS. 7C-7F depict formation of additional layers on top of the structure of FIG. 7B. Specifically, FIGS. 7C-7F show a cross section of the memory array 214 from a perspective that is perpendicular to cross section of FIG. 7A. FIG. 7C depicts results after step 616.

In step 618, material for the bottom electrodes 234 for the memory cells is deposited. The bottom electrodes 234 may be formed from TiN. However, diode electrodes 213 can be formed from another material such as titanium, tantalum, tantalum nitride, tungsten, tungsten nitride, copper, and aluminum. The material for the bottom electrodes 234 can be deposited using a variety of techniques including, but not limited to, chemical vapor deposition (CVD), physical vapor deposition (PVD), atomic layer deposition (ALD), and sputtering.

In step 620, material for reversible resistivity-switching elements 202 is deposited. Many different types of materials can be deposited in this step. In one embodiment, the reversible resistivity-switching elements 202 are formed from a metal oxide ($MeO_x$). The $MeO_x$ can be deposited using a variety of techniques including, but not limited to, chemical vapor deposition (CVD), physical vapor deposition (PVD), atomic layer deposition (ALD), and sputtering. In one embodiment, the reversible resistivity-switching elements 202 are $Ge_2Sb_2Te_5$ (GST). In some embodiments, the reversible resistivity-switching elements 202 are formed from a carbon material. A reversible resistivity-switching elements 202 that is formed from carbon may comprise any combination of amorphous and graphitic carbon. In one embodiment, the reversible resistivity-switching elements 202 are carbon nanotubes (CNT).

Figure 7D:
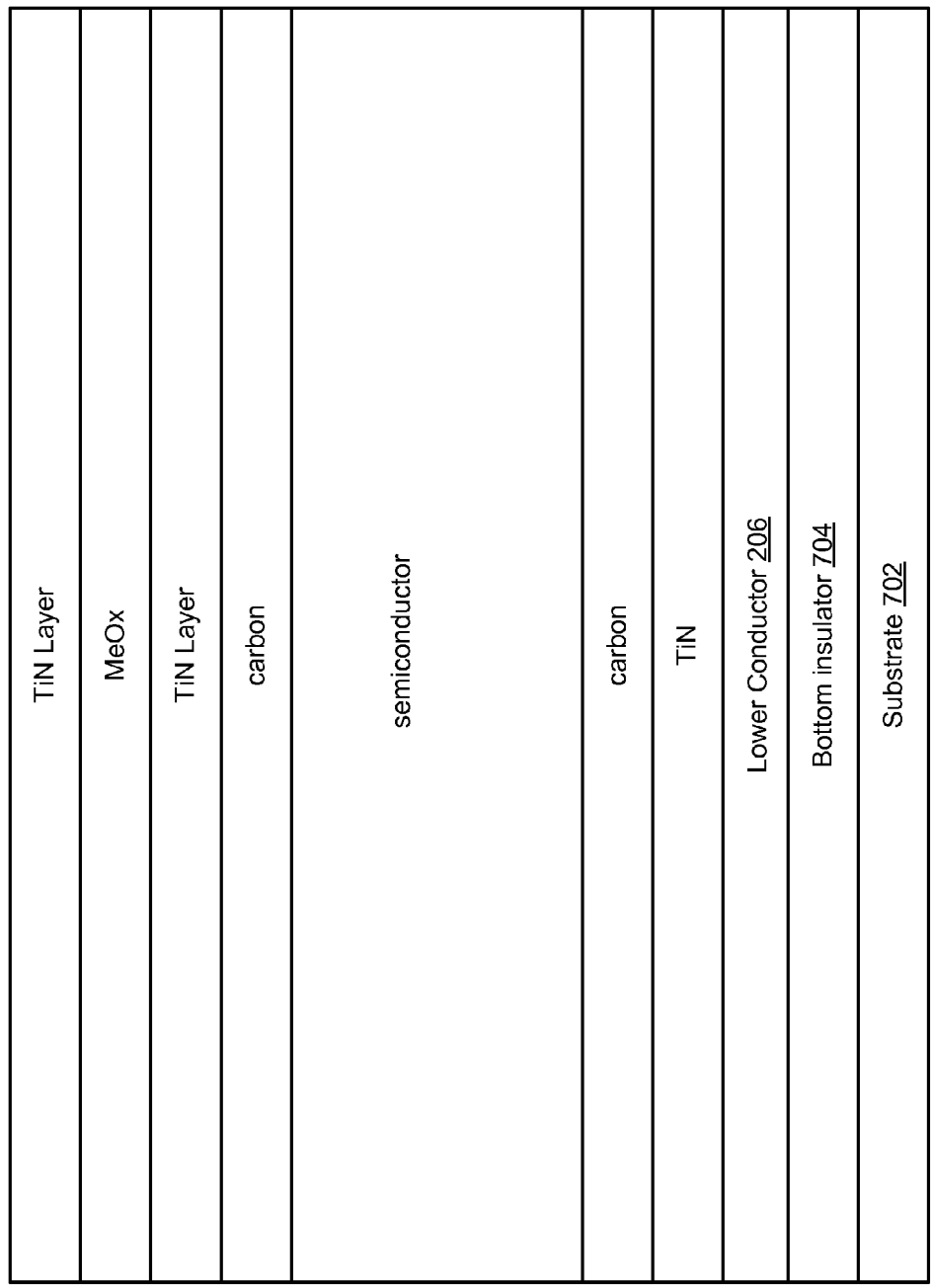

In step 622, material for top electrodes 232 is deposited. The top electrodes 232 may be formed from a wide variety of materials including, but not limited to, platinum, TiN, and TaN. However, top electrodes 232 can be formed from another material such as titanium, tantalum, tungsten, tungsten nitride, copper, and aluminum. The material for top electrodes 232 can be deposited using a variety of techniques including, but not limited to, chemical vapor deposition (CVD), physical vapor deposition (PVD), atomic layer deposition (ALD), and sputtering. FIG. 7D depicts results after step 622 for an example in which the top electrodes 213 to be formed from TiN and the reversible resistivity-switching elements 202 are to be formed from a metal oxide ($MeO_x$).

In step 624, a thermal anneal is performed. In one embodiment, the thermal anneal serves to cause at least some of the amorphous carbon that was deposited in step 612 and 616 to carbon having sp2 carbon bonds. In some embodiments, at least 50% of the carbon has sp2 carbon bonds. In one embodiment, the thermal anneal also serves to activate any dopants that were added. The thermal anneal may also cause the silicon that was deposited in step 614 to become polysilicon. However, forming polysilicon is not an absolute requirement. Example parameters for the thermal anneal is a rapid thermal anneal (RTA) at 700 C for 60 seconds. However, other temperatures and times could be used.

Figure 7E:
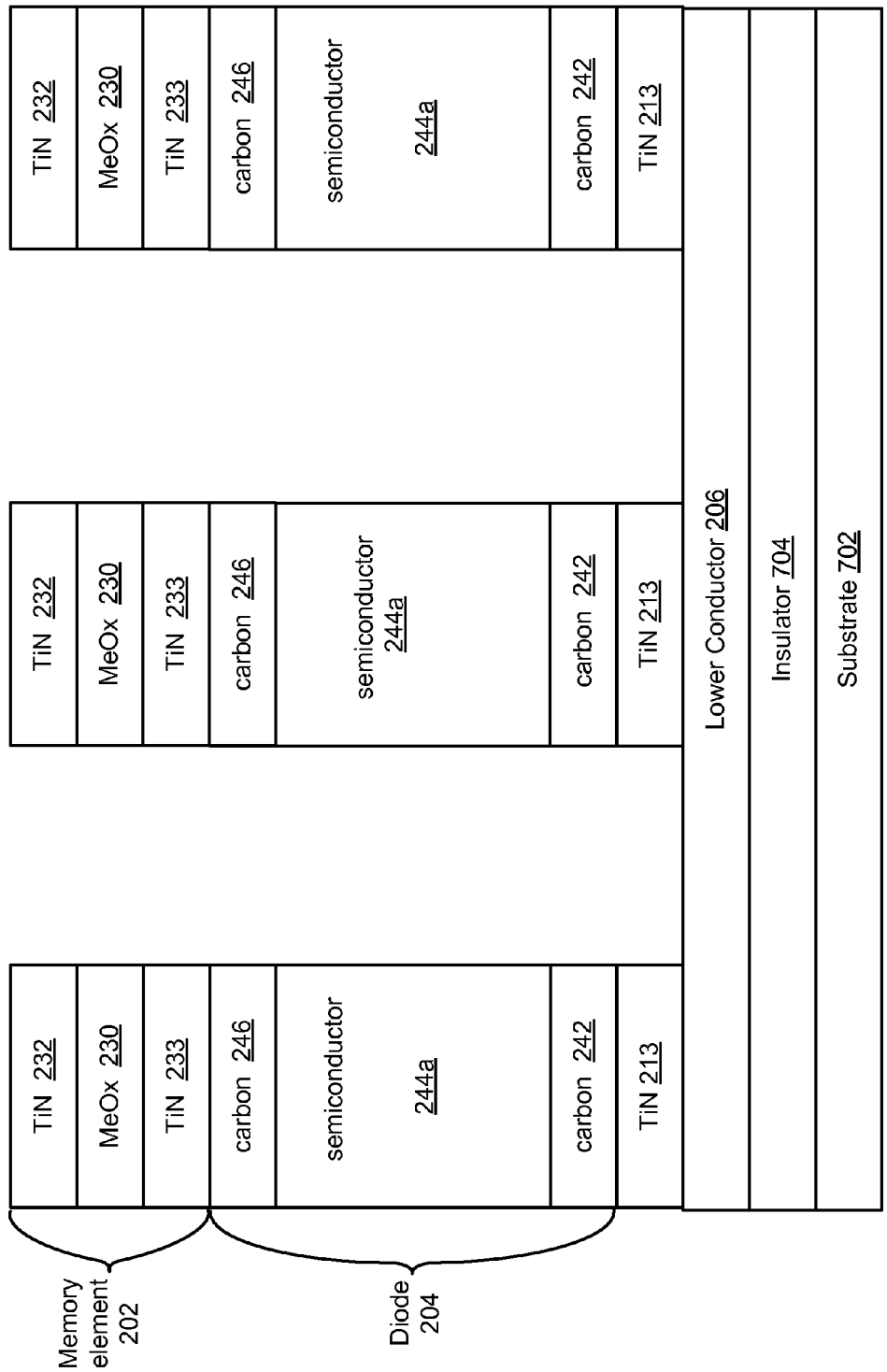

In step 626, pillars are formed out of the material deposited in steps 610-622. Pillars can be formed using any suitable masking and etching process. For example, photoresist can be deposited, patterned using standard photolithography techniques, and etched. Then, the photoresist may be removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask. Other hard mask material such as advanced patterning film (APF) can be used with BARC and DARC as hard mask. In some embodiments, the pillars have about the same pitch and about the same width as conductors 206 below, such that each pillar is formed on top of a conductor 206. Some misalignment can be tolerated. FIG. 7E depicts results after step 624 in which each pillar corresponds to one memory cell 200 having a carbon/semiconductor/carbon diode 204 in series with a memory element 202.

In step 628, dielectric material is deposited over and between the semiconductor pillars, filling the gaps between them. The dielectric material can be any known electrically insulating material, such as silicon oxide, silicon nitride, or silicon oxynitride. In one embodiment, silicon dioxide is used as the insulating material. The dielectric material on top of pillars is removed, exposing the tops of pillars separated by dielectric material, and leaving a substantially planar surface. This removal of dielectric overfill can be performed by any process known in the art, such as CMP or etchback.

Figure 7F:
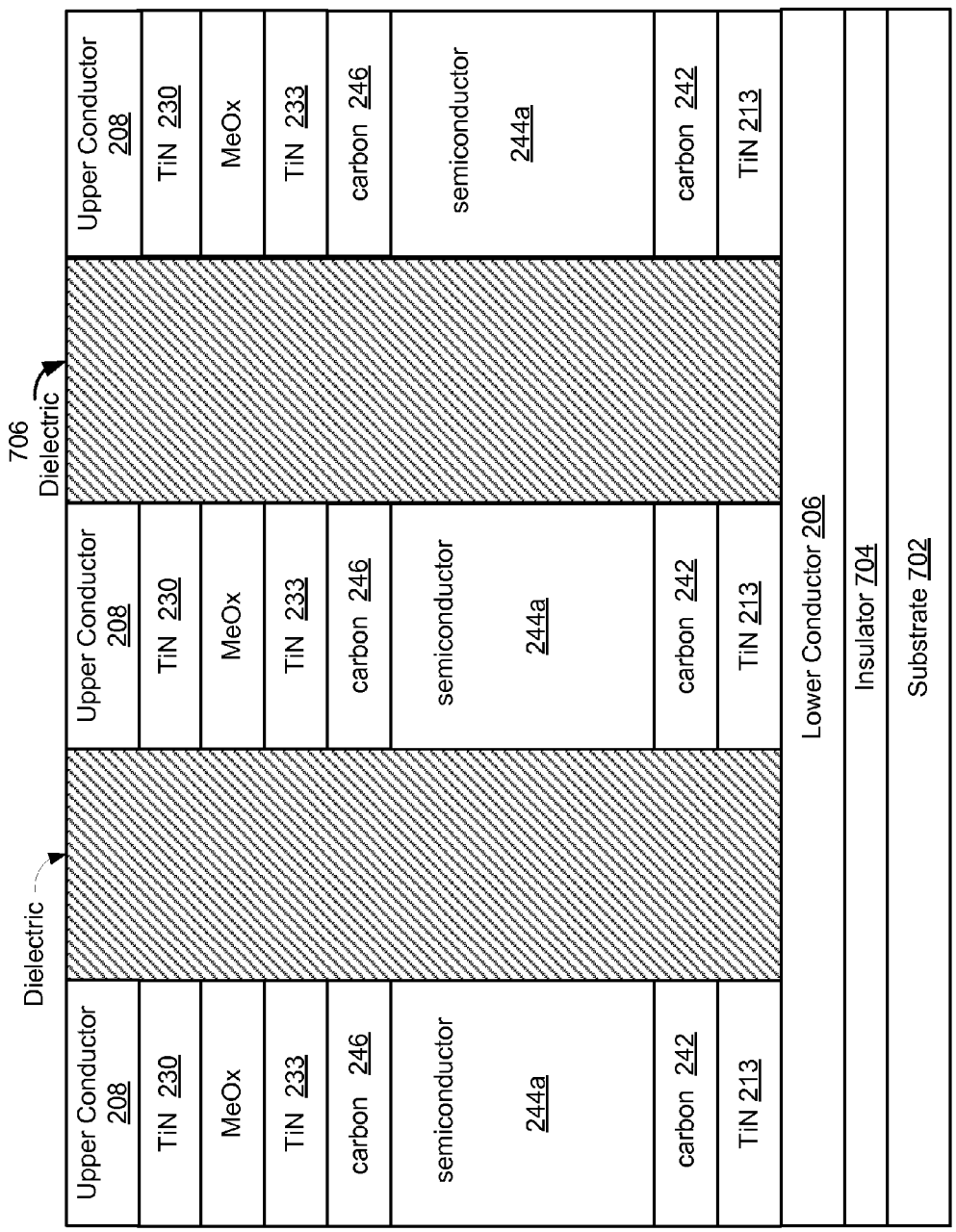

Next, second or upper conductors 208 are formed in step 630. Formation of upper conductors 208 may include depositing material for upper conductors over the dielectric material that was deposited in step 628 and the tops of the top electrodes 230. The conducting layer may comprise any conducting material known in the art, such as tungsten, or other materials, including tantalum, titanium, copper, cobalt, or alloys thereof. The material is then patterned and etched using any suitable masking and etching process to form substantially parallel, substantially coplanar conductors 208. In one embodiment, photoresist is deposited, patterned by photolithography and the layers etched, and then the photoresist removed using standard process techniques. A dielectric material may be deposited over and between conductors 208. The dielectric material can be any known electrically insulating material, such as silicon oxide, silicon nitride, or silicon oxynitride. In one embodiment, silicon dioxide deposited by a high-density plasma method is used as dielectric material. Excess dielectric material on top of conductor rails 208 may be removed, exposing the tops of conductors 208 separated by dielectric material, and leaving a substantially planar surface. This removal of dielectric overfill to form the planar surface can be performed by any process known in the art, such as chemical mechanical polish (CMP) or planarization etchback. FIG. 7F depicts results after forming the top conductors 208.

One embodiment disclosed herein includes diode comprising a first region that includes a first region that includes primarily elemental carbon, a second region that includes primarily elemental carbon, and a third region that includes at least one material that provides a tunneling-barrier between the first region and the second region. The elemental carbon in the first region may include primarily sp2 bonded carbon. Likewise, the elemental carbon in the second region may include primarily sp2 bonded carbon. The at least one material that provides a tunneling-barrier between the first region and the second region may include at least one semiconductor. The at least one semiconductor may be undoped or lightly doped. The at least one material that provides a tunneling-barrier between the first region and the second region may include an insulator.

One embodiment disclosed herein includes forming a diode. The method includes forming a first region that includes primarily elemental carbon, forming a second region that includes primarily elemental carbon, and forming a third region that includes at least one material that provides a tunneling-barrier between the first region and the second region. Forming the first region and forming the second region may includes depositing amorphous carbon in the first region and the second region, and performing a thermal anneal to form primarily sp2 bonded carbon from the amorphous carbon in the first region and the second region. The at least one material that provides a tunneling-barrier between the first region and the second region may include at least one semiconductor. The at least one semiconductor may be undoped or lightly doped. The at least one material that provides a tunneling-barrier between the first region and the second region may include an insulator.

One embodiment includes a non-volatile storage device comprising a first plurality of conductors, a second plurality of conductors, and a plurality of memory cells configured between the first and second plurality of conductors in a cross-point array configuration. Each of the memory cells includes a reversible resistivity-switching element, and a diode in series with the reversible resistivity-switching element. The diode includes a first region that includes primarily sp2 bonded carbon, a second region that includes primarily sp2 bonded carbon, and a third region that includes at least one material that provides a tunneling-barrier between the first region and the second region.

One embodiment includes a method of forming a non-volatile storage device. The method comprises forming a first plurality of conductors, forming a second plurality of conductors, and forming a plurality of memory cells configured between the first and second plurality of conductors in a cross-point array configuration. Forming an individual one of the plurality of memory includes forming a reversible resistivity-switching element, and forming a diode in series with the reversible resistivity-switching element. Forming the diode includes forming a first region that includes that includes primarily sp2 bonded carbon, forming a second region that includes primarily sp2 bonded carbon, and forming a third region that includes at least one material that provides a tunneling-barrier between the first region and the second region.

One embodiment includes a diode that comprises a first region that includes primarily sp2 bonded carbon, a second region that includes primarily sp2 bonded carbon, and a third region that includes at least one semiconductor between the first region and the second region.

One embodiment includes a method of forming a diode that comprises forming a first region that includes primarily sp2 bonded carbon, forming a second region that includes primarily sp2 bonded carbon, and forming a third region that includes at least one semiconductor between the first region and the second region.

The foregoing detailed description has been presented for purposes of illustration and description. It is not intended to be exhaustive or be limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A diode comprising:
  a first region that includes primarily elemental carbon;
  a second region that includes primarily elemental carbon; and
  a third region that provides a single tunneling-barrier between the first region and the second region, the third region includes at least one semiconductor region that provides the single tunneling-barrier between the first region and the second region, wherein at equilibrium the at least one semiconductor region is depleted.

2. The diode of claim 1, wherein the elemental carbon in the first region includes primarily sp2 bonded carbon and the elemental carbon in the second region includes primarily sp2 bonded carbon.

3. The diode of claim 2, wherein at least 50% of the carbon in the first region is sp2 bonded carbon and at least 50% of the carbon in the second region is sp2 bonded carbon.

4. The diode of claim 1, wherein at least 50% of the atoms in the first region are elemental carbon and at least 50% of the atoms in the second region are elemental carbon.

5. The diode of claim 1, wherein the at least one semiconductor region is undoped.

6. The diode of claim 1, wherein the at least one semiconductor region is lightly doped.

7. The diode of claim 1, wherein the at least one semiconductor region includes predominantly silicon, predominantly germanium, a silicon-germanium alloy, or separate regions of silicon and germanium.

8. The diode of claim 1, wherein the third region that provides a single tunneling-barrier between the first region and the second region has a first portion near the first region that includes a p-type dopant and a second portion near the second region that includes an n-type dopant.

9. The diode of claim 1, wherein the first region includes primarily elemental carbon that is doped with an impurity and the second region includes primarily elemental carbon that is doped with an impurity.

10. A diode comprising:
  a first region that includes primarily sp2 bonded carbon;
  a second region that includes primarily sp2 bonded carbon; and
  a third region that includes at least one semiconductor region between the first region and the second region, at equilibrium the at least one semiconductor region is depleted.

11. The diode of claim 10, wherein at least 50% of the carbon in the first region is sp2 bonded carbon and at least 50% of the carbon in the second region is sp2 bonded carbon.

12. The diode of claim 1, wherein the diode is in series with a reversible resistivity-switching element in a memory cell.

13. The diode of claim 1, wherein the diode is a steering element in a non-volatile storage device.

14. The diode of claim 13, wherein the non-volatile storage device comprises:
  a first plurality of conductors;
  a second plurality of conductors; and
  a plurality of memory cells configured between the first and second plurality of conductors in a cross-point array configuration, each of the memory cells including:
    a reversible resistivity-switching element, wherein the diode is in series with the reversible resistivity-switching element.

15. The diode of claim 10, wherein the diode is in series with a reversible resistivity-switching element in a memory cell.

16. The diode of claim 10, wherein the diode is a steering element in a non-volatile storage device.

17. The diode of claim 16, wherein the non-volatile storage device comprises:
   a first plurality of conductors;
   a second plurality of conductors; and
   a plurality of memory cells configured between the first and second plurality of conductors in a cross-point array configuration, each of the memory cells including:
   a reversible resistivity-switching element, wherein the diode is in series with the reversible resistivity-switching element.

18. The diode of claim 10, wherein the at least one semiconductor region is undoped.

19. The diode of claim 10, wherein the at least one semiconductor region is lightly doped.

20. The diode of claim 10, wherein the at least one semiconductor region comprises a region of silicon between two regions of germanium.

21. The diode of claim 10, wherein the at least one semiconductor region comprises predominantly silicon.

22. The diode of claim 10, wherein the at least one semiconductor region comprises predominantly germanium.

23. The diode of claim 10, wherein the at least one semiconductor region comprises a silicon-germanium alloy.

* * * * *